United States Patent
Zhao et al.

(10) Patent No.: US 10,432,770 B2
(45) Date of Patent: Oct. 1, 2019

(54) METHOD FOR PROVIDING MULTI-FUNCTION BACK COVER TO MOBILE TERMINAL AND MOBILE TERMINAL THEREOF

(71) Applicant: JRD COMMUNICATION (SHENZHEN) LTD, Shenzhen, Guangdong (CN)

(72) Inventors: Yunguo Zhao, Guangdong (CN); Hongjie Tong, Guangdong (CN); Xiulu Jin, Guangdong (CN); Linfang Li, Guangdong (CN); Ruilin Hou, Guangdong (CN)

(73) Assignee: JRD COMMUNICATION (SHENZHEN) LTD, Shenzhen (CN)

( * ) Notice: Subject to any disclaimer, the term of this patent is extended or adjusted under 35 U.S.C. 154(b) by 0 days.

(21) Appl. No.: 15/573,485

(22) PCT Filed: Apr. 21, 2017

(86) PCT No.: PCT/CN2017/081441
§ 371 (c)(1),
(2) Date: Nov. 13, 2017

(87) PCT Pub. No.: WO2018/054050
PCT Pub. Date: Mar. 29, 2018

(65) Prior Publication Data
US 2018/0359351 A1 Dec. 13, 2018

(30) Foreign Application Priority Data
Sep. 23, 2016 (CN) .......................... 2016 1 0845629

(51) Int. Cl.
*H04M 1/725* (2006.01)
*H01M 2/10* (2006.01)
(Continued)

(52) U.S. Cl.
CPC .... *H04M 1/72527* (2013.01); *G01R 1/06722* (2013.01); *G01R 31/2886* (2013.01);
(Continued)

(58) Field of Classification Search
CPC ..................... H01M 2/1016; H04M 1/72527
See application file for complete search history.

(56) References Cited

U.S. PATENT DOCUMENTS 8,764,458 B1 7/2014 Rathi et al.
9,288,304 B2 3/2016 Lin et al.
(Continued)

FOREIGN PATENT DOCUMENTS

CN 202178803 U 3/2012
CN 202788111 U 3/2013
(Continued)

OTHER PUBLICATIONS

International Search Report on corresponding PCT application (PCT/CN2017/081441) from International Searching Authority (CN) dated Jul. 24, 2017.

*Primary Examiner* — David Bilodeau (57) ABSTRACT

A method for providing a multi-function back cover to a mobile terminal and a mobile terminal thereof includes: providing a plurality of test points on a PCB of a main body of the mobile terminal in advance; providing a plurality of pogo pins at positions corresponding to the test points on a back cover of the mobile terminal, and installing the back cover of the mobile terminal on the main body of the mobile terminal, such that the pogo pins connect with the test points to provide a corresponding function of the back cover of the mobile terminal.

14 Claims, 6 Drawing Sheets

(51) Int. Cl.
*H04M 1/02* (2006.01)
*G01R 31/28* (2006.01)
*G01R 1/067* (2006.01)

(52) U.S. Cl.
CPC ....... *H01M 2/1016* (2013.01); *H04M 1/0274* (2013.01); *H04M 1/72575* (2013.01)

(56) References Cited

U.S. PATENT DOCUMENTS

| | | | | |
|---|---|---|---|---|
| 2005/0114553 | A1* | 5/2005 | Lada | G06F 1/1632 710/1 |
| 2013/0069583 | A1* | 3/2013 | Lemelman | G06F 1/1635 320/107 |
| 2013/0260677 | A1* | 10/2013 | Partovi | H01F 5/003 455/41.1 |
| 2013/0278205 | A1* | 10/2013 | Mullins | G06F 21/44 320/107 |
| 2014/0323182 | A1* | 10/2014 | Kim | H04B 1/3888 455/566 |
| 2016/0234363 | A1 | 8/2016 | Lombardi et al. | |
| 2017/0018938 | A1 | 1/2017 | Kari et al. | |
| 2018/0341015 | A1* | 11/2018 | Qi | G01S 7/03 |
| 2018/0359351 | A1* | 12/2018 | Zhao | H04M 1/72522 |

FOREIGN PATENT DOCUMENTS

| | | |
|---|---|---|
| CN | 203456549 U | 2/2014 |
| CN | 204577492 U | 8/2015 |
| CN | 204596947 U | 8/2015 |

\* cited by examiner

METHOD FOR PROVIDING MULTI-FUNCTION BACK COVER TO MOBILE TERMINAL AND MOBILE TERMINAL THEREOF

CROSS-REFERENCE TO RELATED APPLICATIONS

The present application is a 35 U.S.C. § 371 National Phase conversion of International (PCT) Patent Application No. PCT/CN2017/081441 filed Apr. 21, 2017, which claims foreign priority of Chinese Patent Application No. 201610845629.5, filed on Sep. 23, 2016 in the State Intellectual Property Office of China, the contents of all of which are hereby incorporated by reference.

TECHNICAL FIELD

Embodiments of the present disclosure generally relate to mobile terminal technology, and in particular relate to a method for providing a multi-function back cover to a mobile terminal and a mobile terminal thereof.

BACKGROUND

With the rapid development of mobile terminals such as mobile phones, there is an increasing number of personalized and modularized applications for various mobile terminals.

At present, mobile terminal users are not satisfied with the experience of the mobile terminal itself, and demand more requirements for the extended functions of the mobile terminals. In response, most manufacturers have tried to implement extended functions on the back cover of the mobile terminals but has yet to be realized, which brings great inconvenience to users using the mobile terminals.

SUMMARY

It is an objective of the present disclosure to provide a multi-function back cover to a mobile terminal and a mobile terminal thereof, with the aim of resolving the problem in the prior art that the multi-function back cover is not realized yet and great inconvenience is brought to the users in the process of using the mobile terminal.

A technical scheme adopted by the present disclosure is as follows.

A method for providing a multi-function back cover for a mobile terminal, including:

A, providing a plurality of test points on a PCB of a main body of the mobile terminal in advance;

B, providing a plurality of pogo pins at positions corresponding to the test points on the back cover of the mobile terminal; and C, installing the back cover of the mobile terminal on the main body of the mobile terminal, such that the pogo pins connect with the test points to provide a corresponding function of the back cover of the mobile terminal;

wherein the main body of the mobile terminal is provided with a first battery management chip or a baseband chip;

wherein the plurality of test points at least includes a first identification pin Pin1 and a second identification pin Pin2, and levels of the first identification pin Pin1 and the second identification pin Pin2 are detected so as to determine one or more functions of the back cover of the mobile terminal installed on the main body of the mobile terminal according to a result of the determination.

Another technical scheme adopted by the present disclosure is as follows.

A method for providing a multi-function back cover for a mobile terminal, including:

A, providing a plurality of test points on a PCB of a main body of the mobile terminal in advance;

B, providing a plurality of pogo pins at positions corresponding to the test points on the back cover of the mobile terminal; and C, installing the back cover of the mobile terminal on the main body of the mobile terminal, such that the pogo pins connect with the test points to provide a corresponding function of the back cover of the mobile terminal.

Still another technical scheme adopted by the present disclosure is as follows.

A mobile terminal with a multi-function back cover, including:

a main body, wherein a plurality of test points are provided on a PCB of the main body of the mobile terminal; and a back cover, wherein a plurality of pogo pins are provided at positions corresponding to the test points on the back cover of the mobile terminal;

wherein, the plurality of test points and the plurality of pogo pins are in elastic contact and a corresponding function is provided according to a function of the back cover of the mobile terminal, when the back cover of the mobile terminal is detachably installed on the main body of the mobile terminal.

In the present disclosure, the plurality of pogo pins are provided on the back cover of the mobile terminal, and the back cover of the mobile terminal are connected with the test points provided on the PCB of the main body of the mobile terminal in advance through the pogo pins, such that the main body of the mobile terminal can realize various functions on the back cover of the mobile terminal, thereby satisfying the varied individual requirements of the users.

DETAILED DESCRIPTION

The present disclosure provides a multi-function back cover to a mobile terminal and a mobile terminal thereof. In order to make the objective, technical scheme, and the advantage of the present disclosure more clear and definite, the present disclosure will now be described in more detail with reference to the accompanying drawings as follows. It is to be understood that the specific embodiments described herein are merely illustrative of the present disclosure and are not intended to limit the present disclosure.

Figure 1:
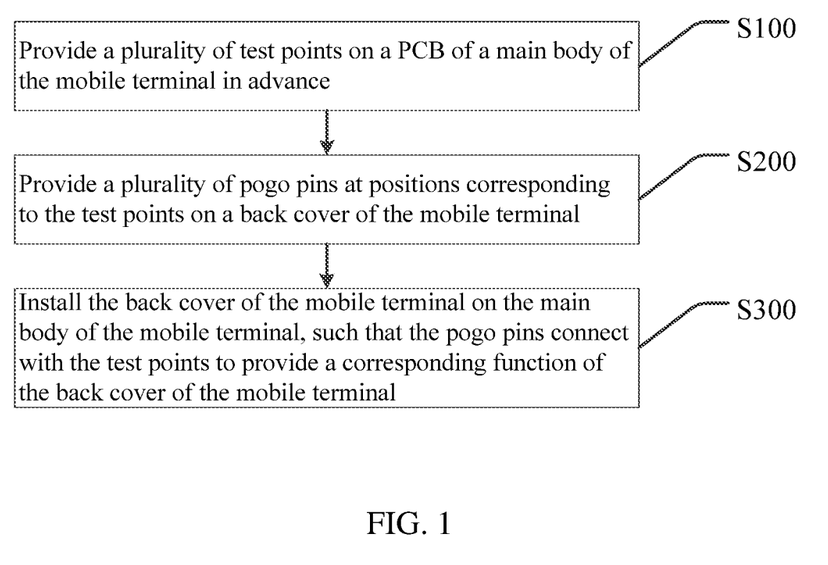
FIG. 1 is a flow chart of a method for providing a multi-function back cover to a mobile terminal according to a preferred embodiment of the present disclosure.

Referring to FIG. 1, a flow chart of a method for providing a multi-function back cover to a mobile terminal according to a preferred embodiment of the present disclosure is depicted. The method may include the following blocks.

At S100: providing a plurality of test points on a PCB of a main body of the mobile terminal in advance;

At S200: providing a plurality of pogo pins at positions corresponding to the test points on the back cover of the mobile terminal; and At S300: installing the back cover of the mobile terminal on the main body of the mobile terminal, such that the pogo pins connect with the test points to provide a corresponding function of the back cover of the mobile terminal;

With the rapid development of mobile terminal technology, users are not satisfied with the experience of the mobile terminal itself, and have more and more requirements for the extended function of the mobile terminal. Extended functions on the back cover of the mobile terminal have become a new direction of research. However, there is no simple and effective method to enable the main body of the mobile terminal to realize various functions on the back cover, which brings obstacles to the users' personalized requirements.

In the present disclosure, the plurality of pogo pins may be provided on the back cover of the mobile terminal, and the back cover of the mobile terminal are connected with the test points provided on the PCB of the main body of the mobile terminal in advance through the pogo pins, such that the main body of the mobile terminal can realize various functions on the back cover of the mobile terminal, thereby satisfying the varied individual requirements of the users.

Specifically, the pogo pin may be a spring probe formed by riveting three basic components of a needle shaft, a spring, and a needle tube in advance through a precision instrument, and the inside of which is provided with a precise spring structure. The surface of the pogo pin may be generally coated with gold, so as to improve its anti-corrosion function, mechanical properties, electrical performance, etc.

Figure 2:
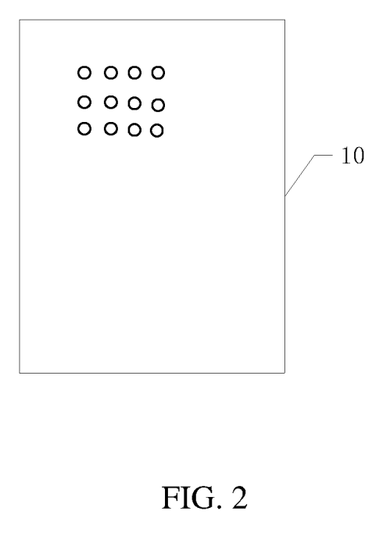
FIG. 2 is a schematic diagram of the structure of a main body of a mobile terminal and test points thereof according to an embodiment of the present disclosure.

Preferably, as shown in FIG. 2, in the present disclosure, twelve test points are provided on a PCB of a main body 10 of a mobile terminal in advance. The twelve test points include a first identification pin Pin1, a second identification pin Pin2, a detection pin Pin3, a ground pin Pin4, a charge input pin Pin5, a charge output pin Pin6, a power supply pin Pin7, a first I2C (inter-integrated circuit) control pin Pin8, a second I2C control pin Pin9, a left audio input pin Pin10, a right audio input pin Pin11, and a reset pin Pin12.

Furthermore, the first identification pin Pin1 and the second identification pin Pin2 are in a pulled state by default, that is, the first identification pin Pin1 and the second identification pin Pin2 are in a high level state before being connected to the pogo pins on the back cover of the mobile terminal. When the first identification pin Pin1 and the second identification pin Pin2 are at the high level, which is denoted as (1,1); when the first identification pin Pin1 and the second identification pin Pin2 are connected with the pogo pins on the back cover of the mobile terminal, which are in a low level state, and is denoted as (0,0).

Accordingly, the present disclosure detects levels of the first identification pin Pin1 and the second identification pin Pin2 so as to determine function(s) of the back cover of the mobile terminal installed on the main body of the mobile terminal according to a result of the determination.

Figure 3:
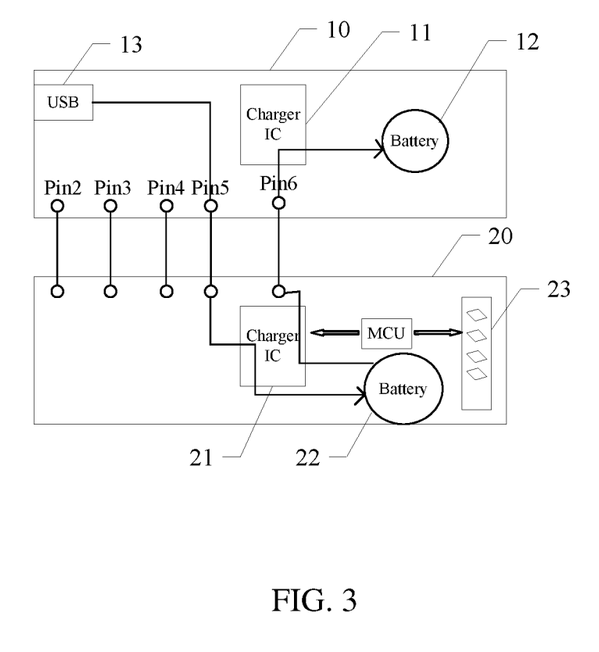
FIG. 3 is a schematic diagram of a connection between a charger back cover of a mobile terminal and a main body of the mobile terminal according to an embodiment of the present disclosure.

Referring to FIG. 3, a schematic diagram of a connection between a charger back cover of a mobile terminal and a main body of the mobile terminal according to an embodiment of the present disclosure is depicted. In the present disclosure, as shown in FIG. 3, there are five pogo pins provided on the back cover of the mobile terminal. When the back cover of the mobile terminal is installed on the main body of the mobile terminal, the five pogo pins are connected to the second identification pin Pin2, the detection pin Pin3, the ground pin Pin4, the charge input pin Pin5, and the charge output pin Pin6, respectively, so as to provide a charger function on the back cover of the mobile terminal.

Specifically, the detection pin Pin3 is for detecting whether there has been a multi-function cover inserted into the main body of the mobile terminal. Since there is merely the second identification pin Pin2 connected with the pogo pin, the detected second identification pin Pin2 is in a low level state, which is denoted as 0. Hence, when the detected level state of the first identification pin Pin1 and the second pin Pin2 is (1,0), then determine that the installed back cover has a charger function.

Furthermore, as shown in FIG. 3, the main body 10 of the mobile terminal is provided with a first battery management chip 11, a first battery 12, and a USB interface 13. A back cover 20 of the mobile terminal is provided with a second battery management chip 21, a second battery 22, an indicator light 23 for indicating the remaining electric quantity of the second battery 22, and a MCU (micro controller unit) configured to control the enable and disable of the indicator light 23.

Furthermore, when the back cover 20 of the mobile terminal is installed on the main body 10 of the mobile terminal, the five pogo pins on the back cover 20 of the mobile terminal connect to the second identification pin Pin2, the detection pin Pin3, the ground pin Pin4, the charge input pin Pin5, and the charge output pin Pin6, respectively. A charger uses a USB interface 13 to charge the second battery 22 through the charge input pin Pin5, while the second battery 22 charges the first battery 12 through the charge output pin Pin6. The MCU displays the electric quantity of the second battery 22 by controlling four indicator lights 23, thereby prompting the user. Preferably, the first battery management chip 11 and the second battery management chip 21 are respectively used to manage the input and output voltages of the first battery 12 and the second battery 22.

Figure 4:
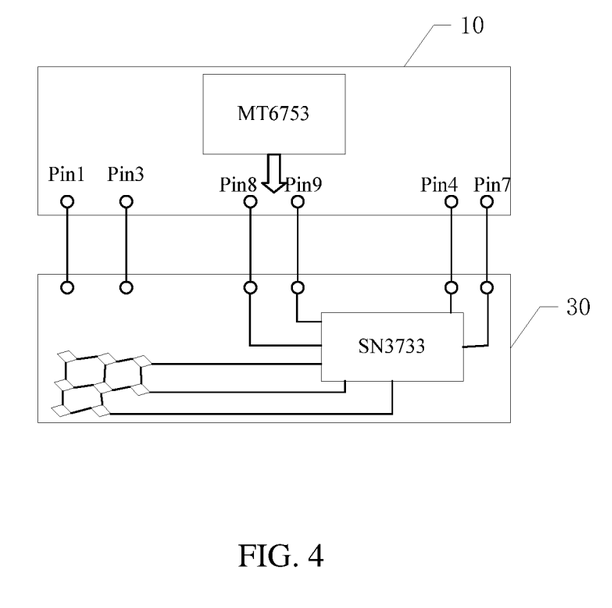
FIG. 4 is a schematic diagram of a connection between a brilliant LED back cover of a mobile terminal and a main body of the mobile terminal according to an embodiment of the present disclosure.

Furthermore, referring to FIG. 4, a schematic diagram of a connection between a brilliant LED back cover of a mobile terminal and a main body of the mobile terminal according to an embodiment of the present disclosure is depicted. There are six pogo pins provided on a brilliant LED back cover 30 of the mobile terminal. When the brilliant LED back cover 30 of the mobile terminal is installed on the main body 10 of the mobile terminal, the six pogo pins connect to the first identification pin Pin1, the detection pin Pin3, the ground pin Pin4, the power supply pin Pin7, the first I2C control pin Pin8, the second I2C control pin Pin9, respectively, to provide a brilliant LED function on the back cover of the mobile terminal.

Specifically, as shown in FIG. 4, the detection pin Pin3 is for detecting whether there has been a multi-function cover inserted into the main body of the mobile terminal. Since there is merely the first identification pin Pin1 connected with the pogo pin, the detected first identification pin Pin1 is in a low level state, which is denoted as 0. Hence, when the detected level state of the first identification pin Pin1 and the second pin Pin2 is (0,1), then determine that the installed back cover has a brilliant LED function.

Furthermore, as shown in FIG. 4, the main body 10 of the mobile terminal is provided with a baseband chip of the type MT6753, the brilliant LED back cover 30 is provided with a control chip of the type SN3722, and the main body 10 of the mobile terminal provides power to the brilliant LED back cover 30 through the power supply pin Pin7. The control chip SN3722 is stored with fixed LED display pattern(s), the baseband chip MT6753 of the main body 10 of the mobile terminal transmits LED flashing instructions through the first I2C control pin Pin8 and the second I2C control pin Pin9, and the control chip SN3722 selects LED flashing pattern(s) according to the received instruction.

Figure 5:
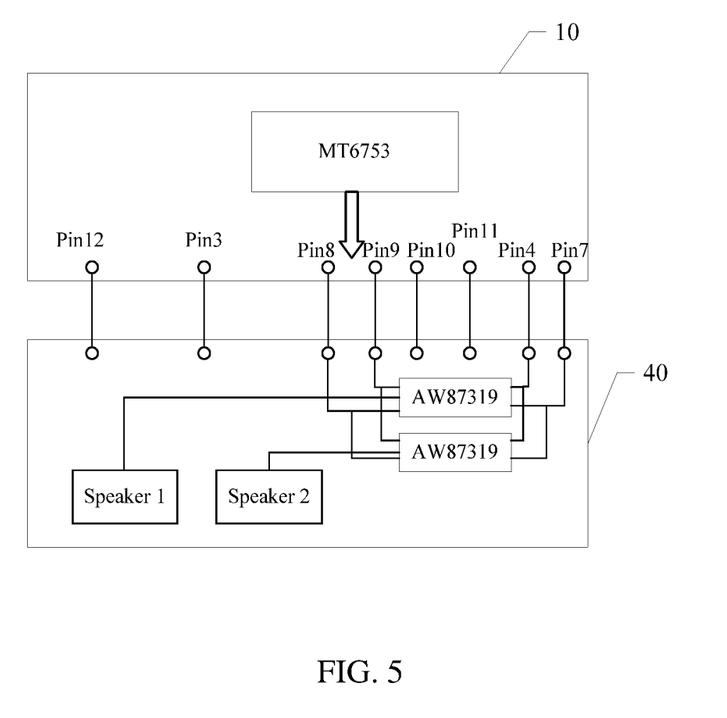
FIG. 5 is a schematic diagram of a connection between a subwoofer back cover of a mobile terminal and a main body of the mobile terminal according to an embodiment of the present disclosure.

Furthermore, referring to FIG. 5, a schematic diagram of a connection between a subwoofer back cover of a mobile terminal and a main body of the mobile terminal according to an embodiment of the present disclosure is depicted. There are eight pogo pins provided on a subwoofer back cover 40 of the mobile terminal. When the subwoofer back cover 40 of the mobile terminal is installed on the main body 10 of the mobile terminal, the eight pogo pins connect to the detection pin Pin3, the ground pin Pin4, the power supply pin Pin7, the first I2C control pin Pin8, the second I2C control pin Pin9, the left audio input pin Pin10, the right audio input pin Pin11, and the reset pin Pin12, respectively, to provide a subwoofer function on the back cover of the mobile terminal.

Specifically, as shown in FIG. 5, the detection pin Pin3 is for detecting whether there has been a multi-function back cover inserted into the main body of the mobile terminal. Since both the first identification pin Pin1 and the second identification pin Pin2 are not connected with the pogo pins, the detected first identification pin Pin1 and the second identification pin Pin2 are in a high level state, which is denoted as (1,1). Hence, it is determined that what has been inserted is the subwoofer back cover.

Furthermore, as shown in FIG. 5, the main body 10 of the mobile terminal is provided with a baseband chip of the type MT6753, the subwoofer back cover 40 is provided with two audio amplifier chips of the type AW87319, and the two audio amplifier chips control a speaker 1 and a speaker 2, respectively. Specifically, the mobile terminal controls the two audio amplifier chips through the first I2C control pin Pin8 and the second I2C control pin Pin9, respectively. The left audio input pin Pin10 and the right audio input pin Pin11 are audio input terminals, and the inputted audios are outputted through the two speakers after being amplified by the two audio amplifier chips AW87319. Preferably, the audio can be restored to its normal volume through the reset pin Pin12.

Figure 6:
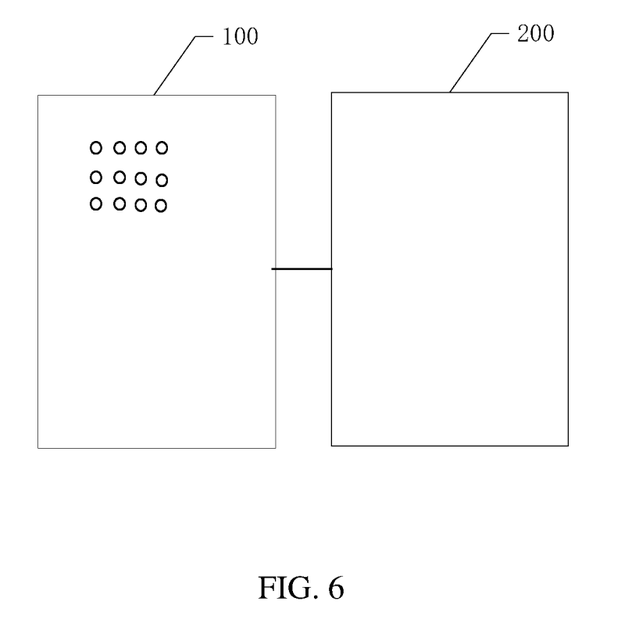
FIG. 6 is a schematic diagram of a mobile terminal with a multi-function back cover according to a preferred embodiment of the present disclosure.

Based on the above-mentioned method, the present disclosure further provides a mobile terminal with a multi-function back cover. As shown in FIG. 6, the mobile terminal includes:

a main body 100, where a plurality of test points are provided on a PCB of the main body 100 of the mobile terminal; and a back cover 200, where a plurality of pogo pins are provided at positions corresponding to the test points on the back cover 200 of the mobile terminal;

in which, when the back cover 200 of the mobile terminal is detachably installed on the main body 100 of the mobile terminal, the plurality of test points and the plurality of pogo pins are in elastic contact and corresponding function(s) are provided according to function(s) of the back cover 200 of the mobile terminal.

Preferably, in the mobile terminal with a multi-function back cover, the amount of the test points is twelve.

Preferably, in the mobile terminal with a multi-function back cover, the twelve test points include the first identification pin Pin1, the second identification pin Pin2, a detection pin Pin3, a ground pin Pin4, a charge input pin Pin5, a charge output pin Pin6, a power supply pin Pin7, a first I2C control pin Pin8, a second I2C control pin Pin9, a left audio input pin Pin10, a right audio input pin Pin11, and a reset pin Pin12.

Preferably, in the mobile terminal with a multi-function back cover, the first identification pin Pin1 and the second identification pin Pin2 are used to detect the level of the back cover of the mobile terminal so as to determine function(s) of the back cover of the mobile terminal according to a result of the determination.

Preferably, in the mobile terminal with a multi-function back cover, there are five pogo pins provided on the back cover of the mobile terminal, and when the back cover of the mobile terminal is installed on the main body of the mobile terminal, the five pogo pins connect to the second identification pin Pin2, the detection pin Pin3, the ground pin Pin4, the charge input pin Pin5, and the charge output pin Pin6, respectively, to provide a charger function on the back cover of the mobile terminal; or there are six pogo pins provided on the back cover of the mobile terminal, and when the back cover of the mobile terminal is installed on the main body of the mobile terminal, the six pogo pins connect to the first identification pin Pin1, the detection pin Pin3, the ground pin Pin4, the power supply pin Pin7, the first I2C control pin Pin8, the second I2C control pin Pin9, respectively, to provide a brilliant LED function on the back cover of the mobile terminal; or there are eight pogo pins provided on the back cover of the mobile terminal, and when the back cover of the mobile terminal is installed on the main body of the mobile terminal, the eight pogo pins connect to the detection pin Pin3, the ground pin Pin4, the power supply pin Pin7, the first I2C control pin Pin8, the second I2C control pin Pin9, the left audio input pin Pin10, the right audio input pin Pin11, and the reset pin Pin12, respectively, to provide a subwoofer function on the back cover of the mobile terminal.

In summary, in the present disclosure, the plurality of pogo pins are provided on the back cover of the mobile terminal, and the back cover of the mobile terminal are connected with the test points provided on the PCB of the main body of the mobile terminal in advance through the pogo pins, such that the main body of the mobile terminal can realize various functions on the back cover of the mobile terminal, thereby satisfying the varied individual requirements of the users.

It is to be understood that the application of the present disclosure is not limited to the above-mentioned examples. For those skilled in the art, it is possible to improve or modify in accordance with the above descriptions, and all such improvements and modifications should be within the scope of the claims appended hereto.

What is claimed is:

1. A method for providing a multi-function back cover for a mobile terminal, comprising:

providing a plurality of test points on a PCB of a main body of the mobile terminal in advance;

providing a plurality of pogo pins at positions corresponding to the test points on the back cover of the mobile terminal; and installing the back cover of the mobile terminal on the main body of the mobile terminal, such that the pogo pins connect with the test points to provide a corresponding function of the back cover of the mobile terminal;

wherein the main body of the mobile terminal is provided with a first battery management chip or a baseband chip;

wherein the plurality of test points at least comprise a first identification pin and a second identification pin, and levels of the first identification pin and the second identification pin are detected so as to determine one or more functions of the back cover of the mobile terminal installed on the main body of the mobile terminal according to a result of the determination;

wherein the providing the plurality of test points on the PCB of the main body of the mobile terminal in advance comprises:

providing twelve test points on the PCB of the main body of the mobile terminal in advance;

wherein the twelve test points comprise the first identification pin, the second identification pin, a detection pin, a ground pin, a charge input pin, a charge output pin, a power supply pin, a first I2C control pin, a second I2C control pin, a left audio input pin, a right audio input pin, and a reset pin.

2. The method of claim 1, wherein the first identification pin and the second identification pin are in a pulled state by default, the first identification pin and the second identification pin are in a high level state before being connected to the pogo pins on the back cover of the mobile terminal; when the first identification pin and the second identification pin are connected to with the pogo pins on the back cover, they are in a low level state.

3. The method of claim 1, wherein five pogo pins are provided on the back cover of the mobile terminal, the five pogo pins respectively connect to the second identification pin, the detection pin, the ground pin, the charge input pin, and the charge output pin to provide a charger function on the back cover of the mobile terminal, when the back cover of the mobile terminal is installed on the main body of the mobile terminal.

4. The method of claim 1, wherein six pogo pins are provided on the back cover of the mobile terminal, the six pogo pins respectively connect to the first identification pin, the detection pin, the ground pin, the power supply pin, the first I2C control pin, the second I2C control pin to provide a brilliant LED function on the back cover of the mobile terminal, when the back cover of the mobile terminal is installed on the main body of the mobile terminal.

5. The method of claim 1, wherein eight pogo pins are provided on the back cover of the mobile terminal, the eight pogo pins respectively connect to the detection pin, the ground pin, the power supply pin, the first I2C control pin, the second I2C control pin, the left audio input, the right audio input, and the reset pin to provide a subwoofer function on the back cover of the mobile terminal, when the back cover of the mobile terminal is installed on the main body of the mobile terminal.

6. The method of claim 1, wherein each of the plurality of pogo pins is a spring probe formed by riveting three basic components of a needle shaft, a spring and a needle tube in advance through a precision instrument.

7. The method of claim 1, wherein a surface of each of the plurality of pogo pins is coated with gold.

8. A method for providing a multi-function back cover for a mobile terminal, comprising:

providing a plurality of test points on a PCB of a main body of the mobile terminal in advance;

providing a plurality of pogo pins at positions corresponding to the test points on the back cover of the mobile terminal; and installing the back cover of the mobile terminal on the main body of the mobile terminal, such that the pogo pins connect with the test points to provide a corresponding function of the back cover of the mobile terminal;

wherein the providing the plurality of test points on the PCB of the main body of the mobile terminal in advance comprises:

providing twelve test points on the PCB of the main body of the mobile terminal in advance;

wherein the twelve test points comprise the first identification pin, the second identification pin, a detection pin, a ground pin, a charge input pin, a charge output pin, a power supply pin, a first I2C control pin, a second I2C control pin, a left audio input pin, a right audio input pin, and a reset pin.

9. The method of claim 8, wherein the levels of the first identification pin and the second identification pin are detected so as to determine one or more functions of the back cover of the mobile terminal installed on the main body of the mobile terminal.

10. The method of claim 8, wherein five pogo pins are provided on the back cover of the mobile terminal, the five pogo pins respectively connect to the second identification pin, the detection pin, the ground pin, the charge input pin, and the charge output pin to provide a charger function on the back cover of the mobile terminal, when the back cover of the mobile terminal is installed on the main body of the mobile terminal; or six pogo pins are provided on the back cover of the mobile terminal, the six pogo pins respectively connect to the first identification pin, the detection pin, the ground pin, the power supply pin, the first I2C control pin, the second I2C control pin to provide a brilliant LED function on the back cover of the mobile terminal, when the back cover of the mobile terminal is installed on the main body of the mobile terminal; or eight pogo pins are provided on the back cover of the mobile terminal, the eight pogo pins respectively connect to the detection pin Pin3, the ground pin Pin4, the power supply pin Pin7, the first I2C control pin Pin8, the second I2C control pin Pin9, the left audio input pin Pin10, the right audio input pin Pin11, and the reset pin Pin12 to provide a subwoofer function on the back cover of the mobile terminal, when the back cover of the mobile terminal is installed on the main body of the mobile terminal.

11. A mobile terminal, comprising:

a main body, wherein a plurality of test points are provided on a PCB of the main body of the mobile terminal; and a back cover, wherein a plurality of pogo pins are provided at positions corresponding to the test points on the back cover of the mobile terminal;

wherein, the plurality of test points and the plurality of pogo pins are elastically contacted and a corresponding function is provided according to a function of the back cover of the mobile terminal, when the back cover of the mobile terminal is detachably installed on the main body of the mobile terminal;

wherein the number of the test points is twelve;

wherein the twelve test points comprise the first identification pin, the second identification pin, a detection pin, a ground pin, a charge input pin, a charge output pin, a power supply pin, a first I2C control pin, a second I2C control pin, a left audio input pin, a right audio input pin, and a reset pin.

12. The mobile terminal of claim 11, wherein the first identification pin and the second identification pin are used to detect the level of the back cover of the mobile terminal so as to determine one or more functions of the back cover of the mobile terminal according to a result of the determination.

13. The mobile terminal of claim 11, wherein five pogo pins are provided on the back cover of the mobile terminal, the five pogo pins respectively connect to the second identification pin, the detection pin, the ground pin, the charge input pin, and the charge output pin to provide a charger function on the back cover of the mobile terminal, when the back cover of the mobile terminal is installed on the main body of the mobile terminal; or six pogo pins are provided on the back cover of the mobile terminal, the six pogo pins respectively connect to the first identification pin, the detection pin, the ground pin, the power supply pin, the first I2C control pin, the second I2C control pin to provide a brilliant LED function on the back cover of the mobile terminal, when the back cover of the mobile terminal is installed on the main body of the mobile terminal; or eight pogo pins are provided on the back cover of the mobile terminal, the eight pogo pins respectively connect to the detection pin, the ground pin, the power supply pin Pin7, the first I2C control pin, the second I2C control pin, the left audio input pin, the right audio input pin, and the reset pin to provide a subwoofer function on the back cover of the mobile terminal, when the back cover of the mobile terminal is installed on the main body of the mobile terminal.

14. The mobile terminal of claim 11, wherein each of the plurality of pogo pins comprises a needle shaft, a spring and a needle tube, and surface of each of the plurality of pogo pins is coated with gold.

* * * * *